United States Patent
Duan et al.

(10) Patent No.: US 10,114,079 B2
(45) Date of Patent: Oct. 30, 2018

(54) SYSTEM AND METHOD FOR IDENTIFYING VEHICLE BATTERY DECAY

(71) Applicant: FORD GLOBAL TECHNOLOGIES, LLC, Dearborn, MI (US)

(72) Inventors: Xiaohong Nina Duan, Canton, MI (US); Xu Wang, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 303 days.

(21) Appl. No.: 15/052,146

(22) Filed: Feb. 24, 2016

(65) Prior Publication Data

US 2017/0242079 A1    Aug. 24, 2017

(51) Int. Cl.
*G01R 31/36* (2006.01)
*B60L 11/18* (2006.01)

(52) U.S. Cl.
CPC ...... *G01R 31/3679* (2013.01); *B60L 11/1857* (2013.01); *B60L 11/1861* (2013.01); *G01R 31/3648* (2013.01); *G01R 31/3651* (2013.01)

(58) Field of Classification Search
CPC .................................................. G01R 31/3679
USPC ....................................................... 320/136
See application file for complete search history.

(56) References Cited

U.S. PATENT DOCUMENTS

| | | | | |
|---|---|---|---|---|
| 6,107,779 A | * | 8/2000 | Hara | G01R 31/3613 320/132 |
| 8,004,243 B2 | * | 8/2011 | Paryani | G01R 31/3624 320/132 |
| 2012/0056591 A1 | * | 3/2012 | Abe | H01M 10/3909 320/132 |
| 2012/0136594 A1 | * | 5/2012 | Tang | G01R 31/3679 702/63 |
| 2012/0290234 A1 | * | 11/2012 | Schaefer | G01R 31/3624 702/63 |
| 2014/0214347 A1 | | 7/2014 | Laskowsky et al. | |
| 2016/0116544 A1 | * | 4/2016 | Li | G01R 31/3624 324/427 |
| 2016/0372935 A1 | * | 12/2016 | Sakata | G01R 31/36 |

* cited by examiner

*Primary Examiner* — Suresh Memula
(74) *Attorney, Agent, or Firm* — David Kelley; Brooks Kushman P.C.

(57) ABSTRACT

A vehicle includes a traction battery. A controller is configured to operate the traction battery according to a capacity estimate. The capacity estimate is based on a difference between a current-based estimation and a voltage-based estimation of a change in battery state of charge over a time interval. The difference is evaluated over a predetermined number of time intervals. When more than a predetermined percentage of the differences exceed a threshold, the capacity estimate is updated based on an average of the differences.

20 Claims, 4 Drawing Sheets

SYSTEM AND METHOD FOR IDENTIFYING VEHICLE BATTERY DECAY

TECHNICAL FIELD

This application generally relates to a system for estimating battery capacity over time.

BACKGROUND

Hybrid and electric vehicles include a high-voltage traction battery to provide stored electrical energy for propulsion and other vehicle functions. Performance of the traction battery may change over time. For example, the maximum amount of energy that may be stored by the traction battery generally decreases over time.

SUMMARY

In some configurations, a vehicle power system includes a controller programmed to operate a battery according to a battery capacity estimate and, in response to differences between current-based estimates and voltage-based estimates of changes in battery states of charge exceeding a magnitude threshold a predetermined number of times, alter the battery capacity estimate based on an average of the differences.

Some configurations may include one or more of the following features. The vehicle power system in which the controller is programmed to update the current-based estimates based on an integration of battery current over associated time intervals and the battery capacity estimate. The vehicle power system in which the controller is programmed to update the voltage-based estimates based on a difference between a first state of charge value associated with a previous ignition cycle and a second state of charge value associated with a present ignition cycle. The vehicle power system in which the controller is programmed to measure a first open-circuit voltage at initiation of the previous ignition cycle and estimate the first state of charge value based on the first open-circuit voltage, and measure a second open-circuit voltage at initiation of the present ignition cycle and estimate the second state of charge value based on the second open-circuit voltage. The vehicle power system in which the controller is programmed to estimate the first state of charge value and the second state of charge value based on one of a plurality of characteristic curves selected based on the battery capacity estimate. The vehicle power system in which the controller is programmed to output a battery age indicator that is based on the battery capacity estimate. The vehicle power system in which the controller is programmed to output the battery age indicator as a ratio of the battery capacity estimate to a beginning-of-life battery capacity. The vehicle power system in which the controller is programmed to retain differences for a predetermined maximum number of time intervals and in which the predetermined number of times is a predetermined percentage of the predetermined maximum number.

In some configurations, a method includes changing by a controller a battery capacity estimate in response to differences between current-based estimates and voltage-based estimates of changes in battery states of charge exceeding a magnitude threshold a predetermined number of times. The method also includes operating by the controller a traction battery for a vehicle according to the battery capacity estimate.

Some configurations may include one or more of the following features. The method may include updating by the controller the current-based estimates according to a quotient of an integration of a battery current over associated time intervals and the battery capacity estimate. The method may include updating by the controller the voltage-based estimates according to a difference between a first state of charge value associated with a previous ignition cycle and a second state of charge value associated a present ignition cycle. The method may include outputting by the controller a battery age indicator that is based on the capacity estimate. The method may include retaining by the controller the differences for a predetermined maximum number of time intervals in which the predetermined number of times is a predetermined percentage of the predetermined maximum number.

In some configurations, a vehicle power system includes a controller programmed to output a battery age indicator based on a battery capacity estimate and, in response to differences between current-based estimates and voltage-based estimates of changes in battery states of charge exceeding a magnitude threshold a predetermined number of times, alter the battery capacity estimate based on an average of the differences.

Some configurations may include one or more of the following features. The vehicle power system in which the controller is programmed to output the battery age indicator as a ratio of the battery capacity estimate to a beginning-of-life battery capacity. The vehicle power system in which the controller is programmed to update the current-based estimates based on an integration of battery current over associated time intervals and the battery capacity estimate. The vehicle power system in which the controller is programmed to update the voltage-based estimates based on a difference between a first state of charge value associated with a previous ignition cycle and a second state of charge value associated with a present ignition cycle. The vehicle power system in which the controller is programmed to measure a first open-circuit voltage at initiation of the previous ignition cycle and estimate the first state of charge value based on the first open-circuit voltage, and measure a second open-circuit voltage at initiation of the present ignition cycle and estimate the second state of charge value based on the second open-circuit voltage. The vehicle power system in which the controller is programmed to estimate the first state of charge value and the second state of charge value based on one of a plurality of characteristic curves selected based on the battery capacity estimate. The vehicle power system in which the controller is programmed to select one of a plurality of characteristic curves relating open-circuit voltage to state of charge for operating a traction battery and, in response to differences associated with a presently selected characteristic curve exceeding differences associated with a next stage-of-life characteristic curve for the predetermined number of times, select the next stage-of-life characteristic curve for operating the traction battery.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
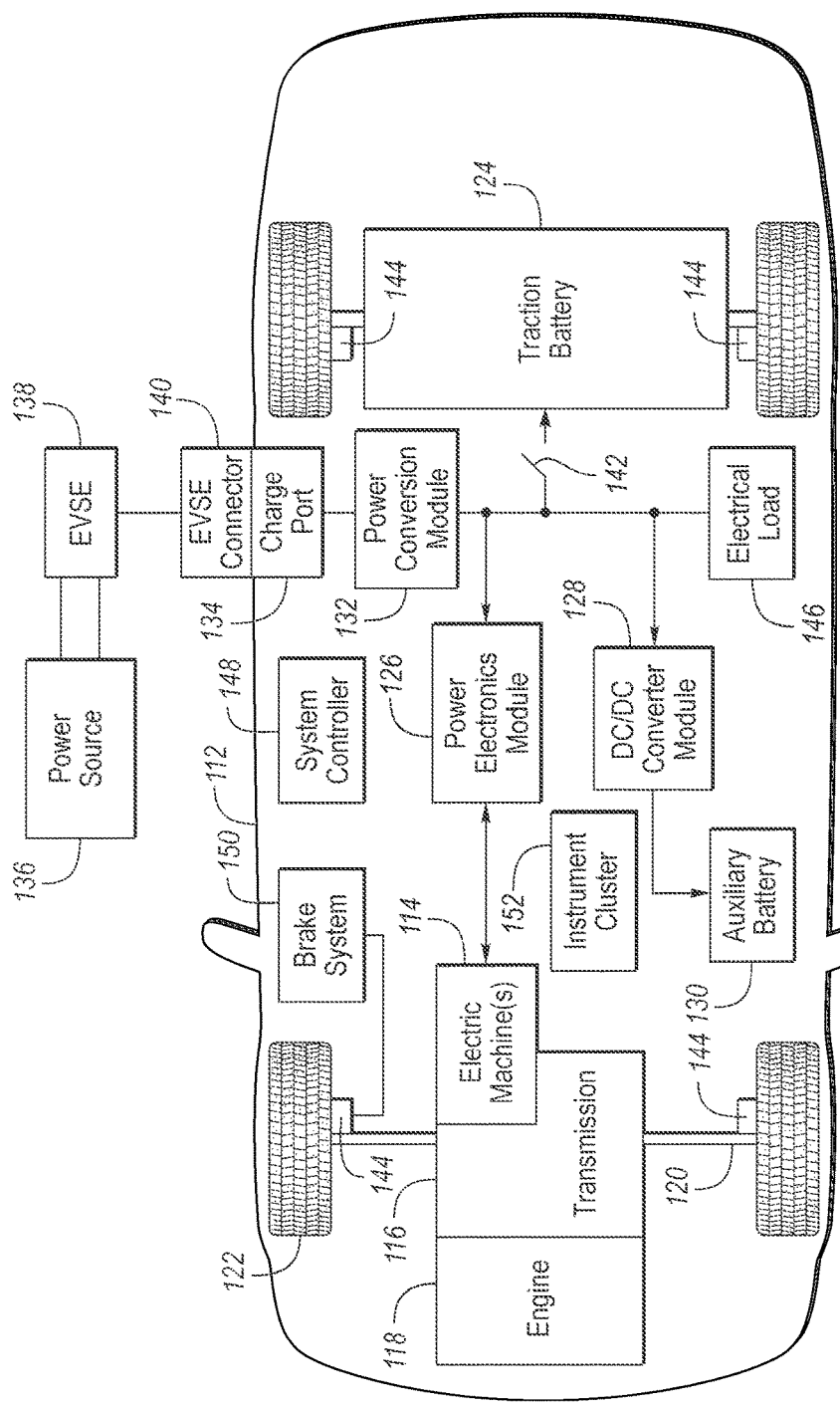
FIG. 1 is a diagram of a hybrid vehicle illustrating typical drivetrain and energy storage components.

FIG. 1 depicts a typical plug-in hybrid-electric vehicle (PHEV). A typical plug-in hybrid-electric vehicle 112 may comprise one or more electric machines 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to the wheels 122. The electric machines 114 can provide propulsion and deceleration capability when the engine 118 is turned on or off. The electric machines 114 also act as generators and can provide fuel economy benefits by recovering energy that would normally be lost as heat in a friction braking system. The electric machines 114 may also reduce vehicle emissions by allowing the engine 118 to operate at more efficient speeds and allowing the hybrid-electric vehicle 112 to be operated in electric mode with the engine 118 off under certain conditions.

A traction battery or battery pack 124 stores energy that can be used by the electric machines 114. A vehicle battery pack 124 typically provides a high voltage direct current (DC) output. The traction battery 124 may be electrically coupled to one or more power electronics modules. One or more contactors 142 may isolate the traction battery 124 from other components when opened and connect the traction battery 124 to other components when closed. The power electronics module 126 may also be electrically coupled to the electric machines 114 and provides the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124. The description herein is equally applicable to a pure electric vehicle. For a pure electric vehicle, the hybrid transmission 116 may be a gear box connected to an electric machine 114 and the engine 118 may not be present.

In addition to providing energy for propulsion, the traction battery 124 may provide energy for other vehicle electrical systems. A vehicle 112 may include a DC/DC converter module 128 that converts the high voltage DC output of the traction battery 124 to a low voltage DC supply that is compatible with low-voltage vehicle loads. An output of the DC/DC converter module 128 may be electrically coupled to an auxiliary battery 130 (e.g., 12V battery). The low-voltage systems may be electrically coupled to the auxiliary battery. Other high-voltage loads 146, such as compressors and electric heaters, may be coupled to the high-voltage output of the traction battery 124. The electrical loads 146 may have an associated controller that operates and controls the electrical loads 146 when appropriate.

The vehicle 112 may be an electric vehicle or a plug-in hybrid vehicle in which the traction battery 124 may be recharged by an external power source 136. The external power source 136 may be a connection to an electrical outlet. The external power source 136 may be electrically coupled to a charger or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 134 of the vehicle 112. The charge port 134 may be any type of port configured to transfer power from the EVSE 138 to the vehicle 112. The charge port 134 may be electrically coupled to a charger or on-board power conversion module 132. The power conversion module 132 may condition the power supplied from the EVSE 138 to provide the proper voltage and current levels to the traction battery 124. The power conversion module 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

One or more wheel brakes 144 may be provided for decelerating the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system connections may be hydraulic and/or electrical. The brake system 150 may include a controller to monitor and coordinate operation of the wheel brakes 144. The brake system 150 may monitor the brake components and control the wheel brakes 144 for vehicle deceleration. The brake system 150 may respond to driver commands and may also operate autonomously to implement features such as stability control. The controller of the brake system 150 may implement a method of applying a requested brake force when requested by another controller or sub-function.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 112. A vehicle system controller (VSC) 148 may be present to coordinate the operation of the various components.

Figure 2:
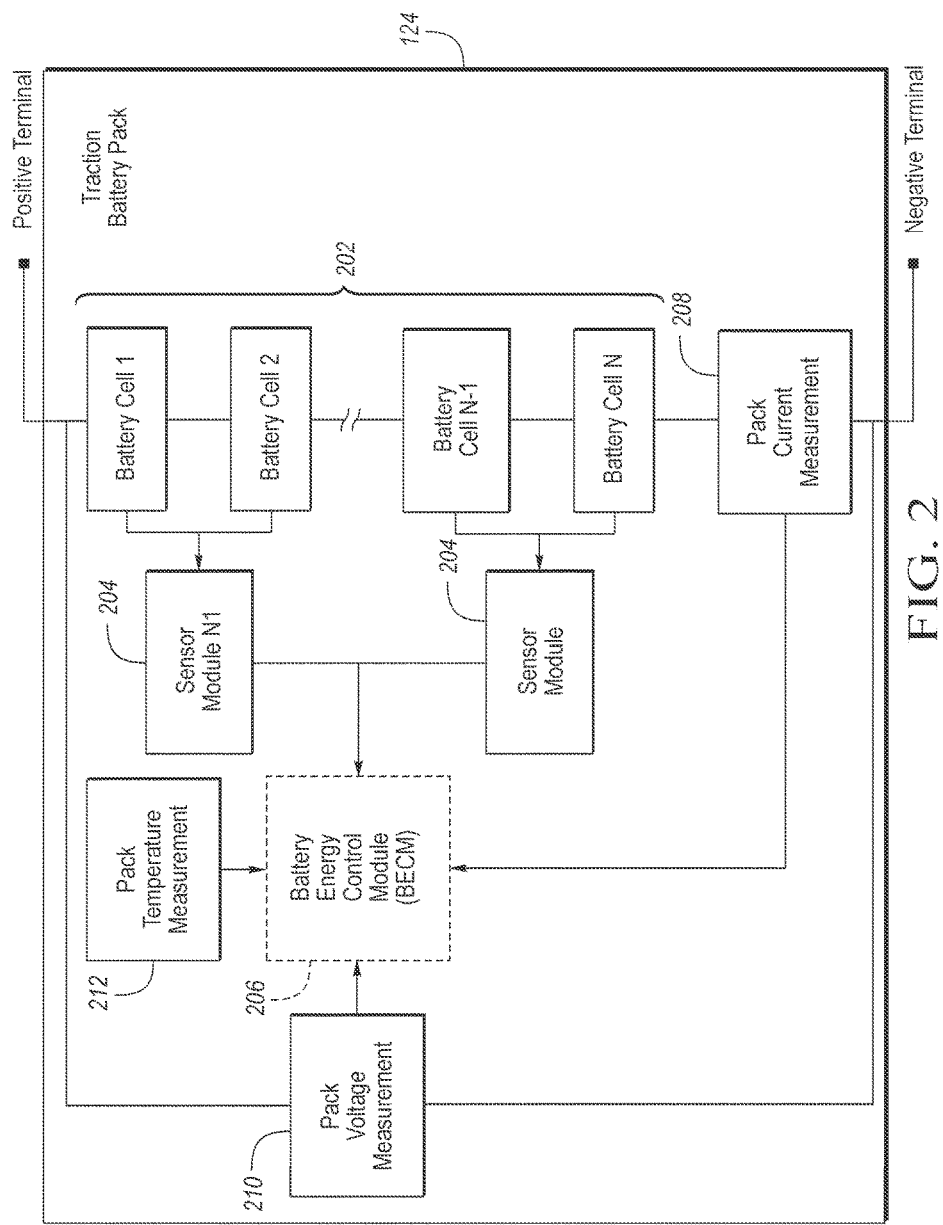
FIG. 2 is a diagram of a possible battery pack arrangement comprised of multiple cells, and monitored and controlled by a Battery Energy Control Module.

A traction battery 124 may be constructed from a variety of chemical formulations. Typical battery pack chemistries may be lead acid, nickel-metal hydride (NIMH) or Lithium-Ion. FIG. 2 shows a typical traction battery pack 124 in a simple series configuration of N battery cells 202. Other battery packs 124, however, may be composed of any number of individual battery cells connected in series or parallel or some combination thereof. A battery management system may have one or more controllers, such as a Battery Energy Control Module (BECM) 206, that monitor and control the performance of the traction battery 124. The battery pack 124 may include sensors to measure various pack level characteristics. The battery pack 124 may include one or more pack current measurement sensors 208, pack voltage measurement sensors 210, and pack temperature measurement sensors 212. The BECM 206 may include circuitry to interface with the pack current sensors 208, the pack voltage sensors 210 and the pack temperature sensors 212. The BECM 206 may have non-volatile memory such that data may be retained when the BECM 206 is in an off condition. Retained data may be available upon the next key cycle.

In addition to the pack level characteristics, there may be battery cell 202 level characteristics that are measured and monitored. For example, the terminal voltage, current, and temperature of each cell 202 may be measured. A system may use one or more sensor modules 204 to measure the battery cell 202 characteristics. Depending on the capabilities, the sensor modules 204 may measure the characteristics of one or multiple of the battery cells 202. The battery pack 124 may utilize up to $N_c$ sensor modules 204 to measure the characteristics of all the battery cells 202. Each of the sensor modules 204 may transfer the measurements to the BECM 206 for further processing and coordination. The sensor modules 204 may transfer signals in analog or digital form to the BECM 206. In some configurations, the functionality of the sensor modules 204 may be incorporated internally to the BECM 206. That is, the hardware of the sensor modules 204 may be integrated as part of the circuitry in the BECM 206 and the BECM 206 may handle the processing of raw signals. The BECM 206 may also include circuitry to interface with the one or more contactors 142 to open and close the contactors 142.

It may be useful to calculate various characteristics of the battery pack. Quantities such as battery power capability, battery capacity, and battery state of charge may be useful for controlling the operation of the traction battery 124 as well as any electrical loads receiving power from the traction battery 124. Battery power capability is a measure of the maximum amount of power the traction battery 124 can provide or the maximum amount of power that the traction battery 124 can receive. Knowing the battery power capability allows the electrical loads to be managed such that the power requested is within limits that the traction battery 124 can handle.

Battery capacity is a measure of a total amount of energy that may be stored in the traction battery 124. The battery capacity may be expressed in units of Amp-hours. Values related to the battery capacity may be referred to as amp-hour values. The battery capacity of the traction battery 124 may decrease over the life of the traction battery 124.

State of charge (SOC) gives an indication of how much charge remains in the traction battery 124. The SOC may be expressed as a percentage of the total charge relative to the battery capacity remaining in the traction battery 124. The SOC value may be output to inform the driver of how much charge remains in the traction battery 124, similar to a fuel gauge. The SOC may also be used to control the operation of an electric or hybrid-electric vehicle. Calculation of SOC can be accomplished by a variety of methods. One possible method of calculating SOC is to perform an integration of the traction battery current over time. This is well-known in the art as ampere-hour integration.

The described components may be part of a vehicle power system that is configured to manage and control power to and from the traction battery 124. The vehicle power system may operate the traction battery 124 to manage the state of charge of the traction battery 124. The traction battery 124 may be charged or discharged according to a target state of charge compared to a present state of charge. For example, when the present state of charge is greater than the target state of charge, the traction battery 124 may be discharged. Operation of the traction battery 124 may be achieved by commanding a torque of the electric machines 114 to draw current from or provide current to the traction battery 124. Operation of the traction battery 124 may further involve commanding operation of the engine 118 to provide power to the electric machines 114 to charge the traction battery 124.

The capacity of the traction battery 124 may decrease with time and vehicle usage. This may be referred to as aging of the traction battery 124. The battery decay or aging is characterized as a decrease in battery capacity and charge/discharge power capability. The battery decay can affect performance and fuel economy of hybrid vehicles if the control strategies are not updated to account for battery aging. In order to properly control the vehicle 112, it is useful to know the capacity as the traction battery 124 ages.

Figure 3:
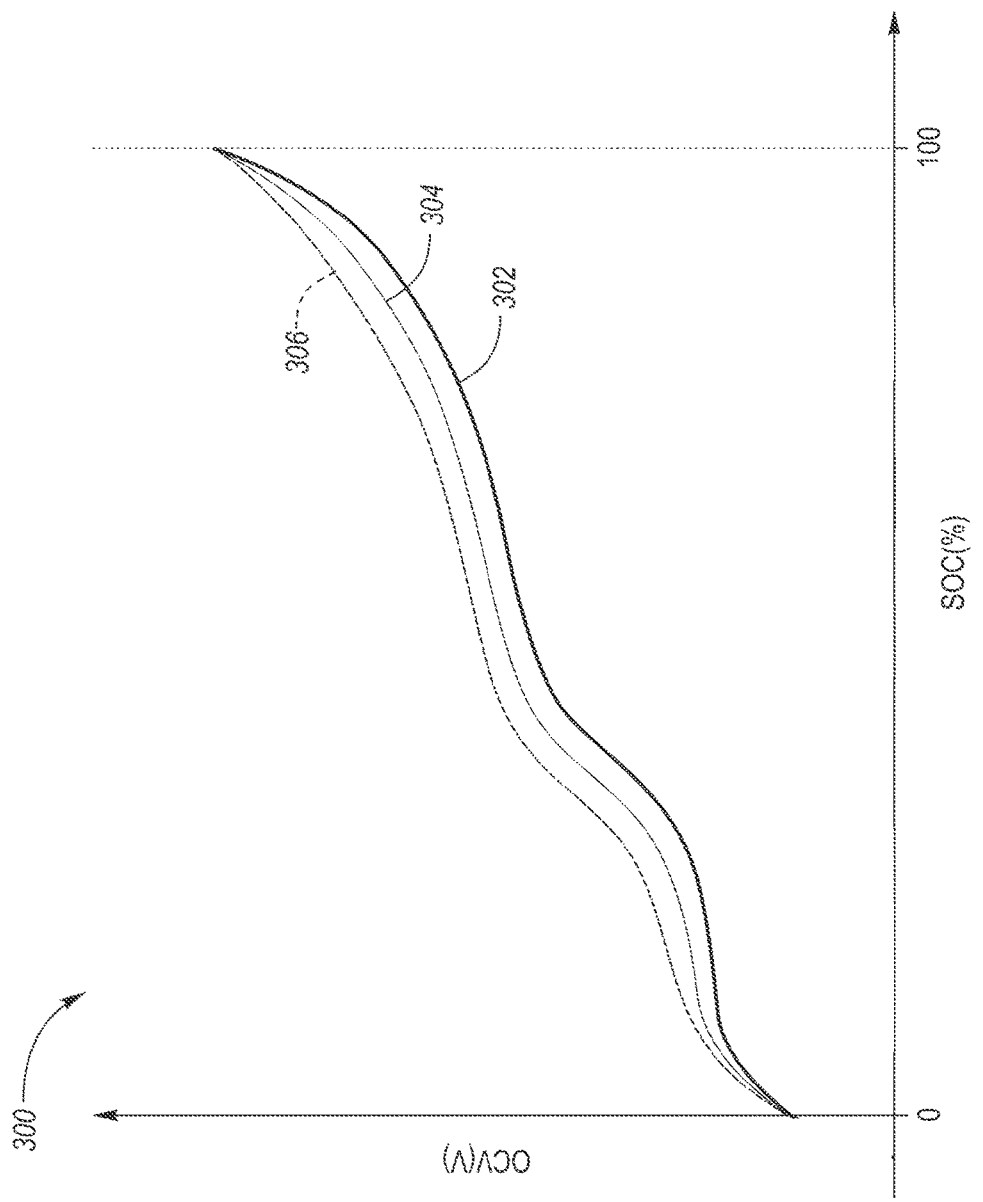
FIG. 3 is a plot illustrating possible open-circuit voltage/state of charge curves over a lifetime of a battery.

FIG. 3 depicts a graph 300 of open-circuit voltage (OCV) of a battery cell 202 as a function of state of charge. A beginning-of-life (BOL) curve 302 may express the OCV-SOC relationship shortly after the battery cell 202 is produced. An end-of-life (EOL) curve 306 may express the OCV-SOC relationship after usage over an expected useful lifetime of the battery cell 202. A middle-of-life (MOL) curve 304 may represent the OCV-SOC relationship at some time between BOL and EOL. The battery management system may rely on a characteristic relationship to determine SOC based on the open-circuit voltage. It is observed, that over the lifetime of the battery cell, that the relationship changes. Therefore, a battery management system programmed with the BOL relationship may not determine the correct SOC based on the voltage at the end of battery life. This may cause issues in that the SOC may not be properly identified and the battery may be operated outside of an expected operating range. Such operation could cause additional aging and may limit vehicle performance.

For the traction battery 124 to function in optimum condition during all useful life stages, control strategies may be updated with a battery health (or aging) status. To adjust control strategies according to the battery age, information regarding the battery health may be provided to the BECM 206. To determine the battery health status, a parameter may be developed for representing the battery health and a method for tracking and reporting the value of the parameter over the useful life of the vehicle may be developed. By estimating the battery capacity, vehicle control strategies may be adjusted to maintain acceptable vehicle performance. For example, SOC window limits (e.g., minimum, low, high, and maximum) may define the normal SOC operating range. As the battery capacity decays, the SOC window limits may be adjusted to ensure that (i) there is enough energy between the low and high SOC window limits, (ii) there is enough power to start the engine to meet emissions standards, and (iii) battery overcharge protection remains robust to sensor measurement inaccuracy or error.

Many hybrid vehicles are configured to operate the traction battery 124 in a narrow operating range to maximize battery life. The OCV-SOC curve may be relatively flat in the operating range, making it difficult to identify the true battery capacity. Large changes in SOC in the relatively flat range may lead to small changes in OCV. In some configurations, the traction battery may be overdesigned so that it is capable of providing higher power and energy than required by the vehicle. In such configurations, the SOC window limits in which the traction battery is operated may be narrower than the SOC range at which the battery is capable of operating in. As the traction battery ages, the true SOC may swing out of the imposed SOC window limits of the controller 206. However, the battery may still provide acceptable performance in spite of being out of the SOC window limits. Further, the SOC window limit may be expanded to allow greater use of the traction battery (e.g., BEV or PHEV application).

Using existing control strategies, the traction battery may be operated far outside of the acceptable SOC window limits. As the battery ages and the true minimum SOC falls below the SOC window limit, the traction battery may be unable to provide enough power to start and operate the vehicle. For example, discharge power of the traction battery may decrease as the battery ages and operates at lower SOC values. It may be useful to monitor the battery aging status to ensure that this operating point is not reached. The battery aging status may be used to generate an alert when the traction battery is approaching a condition in which it cannot support vehicle power demands.

Many battery operating strategies rely on parameters from the BOL of the traction battery 124. The SOC may be estimated by amp-hour integration during operation relative to a BOL battery capacity. As the battery ages, the battery capacity will decrease, therefore the value of SOC change for the same amount of Amp-hour integration relative to a BOL battery capacity will be less than that for the same Amp-hour integration relative to a true battery capacity. The result may be that the controller reported SOC variation is less than the true SOC variation. In other configurations, the SOC is estimated by using an open-circuit voltage measurement and tables representing curves such as in FIG. 3. As the battery ages (e.g, OCV-SOC curve changes), the actual SOC of the traction battery 124 may fall outside of the recommended limits. Further, the BECM 206 may not have knowledge of the condition and may continue operating the traction battery 124 leading to more degradation. Since battery degradation may cause a decrease in battery capacity and an increase in battery internal charge and discharge resistance, a system for estimating battery capacity decay may be beneficial.

Various self-learning algorithms are available for estimating battery capacity. The BECM 206 may be programmed to estimate the traction battery capacity during operation of the vehicle 112. The battery capacity learning strategy may be any algorithm or strategy known in the prior art. For example, battery charge capacity may be estimated as battery current throughput divided by a difference in state of charge (SOC) values. This approach is based on knowledge of two separate SOC values obtained independent of battery capacity. The battery capacity may be calculated as:

$$Q = \frac{\int_{Ti}^{Tf} i\,dt}{SOC_i - SOC_f} = \frac{\text{Throughput}}{SOC_i - SOC_f} \quad (1)$$

where $SOC_i$ and $SOC_f$ are the state of charge values at times $T_i$ and $T_f$ respectively and i is the current flowing to or from the battery. The battery current throughput may be defined as the integral of battery current over a time period. When implemented in a controller 206, the integral may be replaced by a summation of current values multiplied by the sample time. By rearranging equation (1), a change in SOC can be computed as follows:

$$\Delta SOC = \frac{\int_{Ti}^{Tf} i\,dt}{Q} = \frac{\text{Throughput}}{Q} \quad (2)$$

The state of charge values may be based on measured voltages sampled over two key-on/key-off cycles. For a lithium-ion battery, it is well-known that after the battery has been resting a sufficient time, the terminal voltage is approximately equal to the open-circuit voltage of the battery (i.e., $V_t = V_{oc}$). The terminal voltage may be measured at system power-up and the state of charge may be derived from the open-circuit voltage. A relationship between state of charge and open-circuit voltage may be obtained via test data or manufacturer data (see FIG. 3). The throughput value may be accumulated during each ignition cycle and stored in a non-volatile memory for use in the next ignition cycle. Upon power-up in an immediately subsequent ignition cycle, the terminal voltage may be sampled. Other methods of battery capacity may be equally applicable to the methods and systems described herein.

The BECM 206 may be programmed to generate a parameter that represents an age of the traction battery 124. The instrument cluster 152 may be configured to display the age value, in digital or analog form, as a percentage value. In some configurations, the instrument cluster 152 may be configured to display the age value as a bar graph. The instrument cluster 152 may be configured to display a capacity decay value or a capacity retention value. The capacity decay value and/or the capacity retention value may be a percentage of BOL battery capacity. In some configurations, the age of the traction battery 124 may be classified into one of a plurality of predetermined discrete states. When the capacity retention value is greater than a first predetermined threshold, the traction battery 124 may be classified as being in a BOL state. When the capacity retention value is less than a second predetermined threshold that is less than the first predetermined threshold, the traction battery 124 may be classified as being in an old or EOL state. When the capacity retention value is between the first and second threshold values, the traction battery 124 may be classified as being in a MOL state. In some configurations, the instrument cluster 152 may be configured to display an output indicative of the state of life of the traction battery 124. The instrument cluster 152 may display a message that indicates the age of the battery as new, mid-life, or end-of-life depending on the age value. The instrument cluster 152 may display a different color message or symbol for each state of life. Green may represent the BOL state, yellow may represent the MOL state, and red may represent the EOL state. The battery life indication may aid the vehicle owner in understanding upcoming vehicle maintenance needs.

The BECM 206 may be configured to generate and/or receive clock information for establishing time intervals during power-on and power-off conditions. The BECM 206 may store a time stamp associated with values that are stored in non-volatile memory. The time stamp permits subsequent processing of the values based on time intervals.

At ignition on, the BECM 206 may measure the terminal voltage of the battery. The open-circuit voltage may be equivalent to the terminal voltage provided that the battery resting time exceeds a predetermined amount of time. The BECM 206 may be programmed to determine the resting time by using a difference between the previously stored ignition-off time and the present time. The battery SOC at ignition on may be determined from the open-circuit voltage estimate based on OCV-SOC characteristic tables. The BECM 206 may store the open-circuit voltage and SOC values, along with an associated time stamp, in non-volatile memory for later use. When an ignition-on condition occurs, the BECM 206 may update the time and battery temperature information.

During the ignition cycle, the BECM 206 may be programmed to compute an accumulated current throughput value. The BECM 206 may compute an integral of the battery current during the ignition cycle.

At the end of the ignition cycle (e.g., ignition off request), the BECM 206 may store the accumulated current throughput value (along with an associated time stamp) in non-volatile memory for use in a subsequent ignition cycle. In addition, the BECM 206 may measure or receive temperature information from various temperature sensors including battery temperature sensors, ambient air temperature sensors, and cabin temperature sensors. Further, when an ignition-off condition occurs, the BECM 206 may store temperature information with associated time stamps in non-volatile memory for later use. A park time may be computed as a difference in time between the time stamp values stored at ignition-off and the time received at ignition on. The temperature information may include a battery temperature, an ambient temperature, and a cabin temperature.

Battery capacity decay may be affected by the temperature history of the traction battery 124. The BECM 206 may measure one or more temperatures of the traction battery 124 during an ignition-on condition. The temperature of the traction battery 124 may be measured at initialization after the ignition-on condition. The temperature of the traction battery 124 may be measured and stored in non-volatile memory immediately prior to an ignition-off condition.

The BECM 206 may implement a battery life model. A battery capacity retention/decay value may be derived from the battery life model. The battery life model may input traction battery temperatures, accumulated battery current throughput, and performance parameters such as SOC and voltage. The battery capacity retention/decay value may be used as a battery age indicator.

The battery life model may include a parking life model. In response to transition to the ignition-on condition, the parking life update may be triggered. The parking life update may include a thermal model that loads temperature information from the vehicle network and information that is stored in the BECM 206 non-volatile memory. The retained data may include cell temperatures and time stamp data from the prior shutdown and the present ignition cycle. The temperature data may include one or more battery cell temperatures stored when the vehicle turned off during the previous ignition cycle. The temperature data may include a vehicle cabin temperature when the vehicle turned off during previous ignition cycle. The time data may include a time that the BECM 206 turned on in present ignition cycle. The time data may include a time that the BECM 206 turned off during vehicle last operation. The temperature and time data may be used as input to a vehicle thermal model.

The BECM 206 may include a connection (e.g., networked through cloud) to other computing machines to receive additional data. In a networked deployment, the BECM 206 may connect to a computing device operated in a server or a client machine in server-client network environment, or a peer machine in a peer-to-peer (or distributed) network environment. The BECM 206 may also be connected to a device external to the vehicle. When the BECM 206 is connected with the device external to the vehicle, the BECM 206 may be configured to receive ambient temperature data during a prior parking period. The BECM 206 may also use and load the statistic ambient temperature stored in the vehicle via time and vehicle location. The ambient temperature may be input to vehicle thermal model to calculate the cell temperature history during the parking period. The vehicle thermal model may then output the temperature history.

The estimated temperature history may be used as input to a battery life model. The battery life model may use the temperature history and other battery parameters stored in the BECM 206 to calculate the battery capacity retention/decay during the parking period. Upon completion, the updated capacity retention/decay value may be used as an initial value for additional computations. Once the initial capacity retention/decay value is available, a battery model may be executed.

The battery model may calculate the battery capacity retention/decay during the present vehicle operation condition. The capacity retention/decay value may be updated based on battery cell temperatures, the battery current, the battery SOC, the battery voltage, and time data. The battery model may output a battery capacity estimate.

The estimated capacity from the battery model may be compared with capacity computed with measured OCV values at vehicle power up/power down. The measured OCV value and the OCV-SOC curves determined offline may be used to determine any errors in the estimated battery capacity from the battery model. The battery OCV-SOC curve may vary with battery age. If the OCV vs SOC variation over battery life is less than the range of vehicle sensor accuracy/sensitivity capability during entire vehicle life, then only one OCV-SOC curve, which is offline measured for new battery cell, may be used. In other configurations, a plurality of OCV-SOC curves may be used as depicted in FIG. 3. For example, an offline measured cell BOL OCV- SOC curve, a MOL OCV-SOC curve, and an EOL OCV-SOC curve may be defined. The number of curves that will be used may depend on the magnitude of the OCV changes during life and the range that the measurement sensor can sense.

An example of the system is presented for the case of a single stored OCV-SOC curve. When the capacity comparison function is triggered, the system may load the SOC (OCV1) from a previous ignition cycle and the SOC(OCV2) from another previous or a present ignition cycle. The OCV-SOC data may be stored as a table lookup. Interpolation may be used to obtain values that are between stored data points of the table. The SOC values may be obtained by indexing into the lookup tables with the OCV value. The system may further load the accumulated amount of current integration between the time of the OCV1 and OCV2 measurements. The system may implement a buffer that includes information regarding the SOC error between the model and the measured data (OCV based) when the error is outside of a predetermined boundary. The error record may include data for a predetermined maximum number of cycles, N, of the record counting from the first record of an SOC error.

A first estimated change in the state of charge may be based on a current-based estimate of the change. The capacity comparison function may compute a change in SOC based on the accumulated current integration over the previous time period. The change in SOC may be computed as:

$$\Delta SOC_{Ah} = \frac{\int idt}{Capacity_{model}} \quad (3)$$

where the integral term is the accumulated amount of current integrated over the last time period. The estimated battery capacity from the battery model and parking life model may be used in the denominator. The change in SOC value provides the expected change in SOC due to an Amp-hour integration relative to the capacity from the battery model. The battery current may be measured and integrated over the corresponding time interval.

A second estimated change in the state of charge may be based on a voltage-based estimate of the change. The change in SOC may also be determined as an SOC difference based on two voltage measurement values. The change in SOC based on the OCV values may be expressed as:

$$\Delta SOC_{OCV} = SOC(OCV_1) - SOC(OCV_2) \quad (4)$$

where the SOC(x) is derived from the SOC-OCV curve or tables based on the OCV value. The $OCV_x$ values may be measured at time after which the battery has been resting for at least a predetermined amount of time. For example, the $OCV_x$ values may be taken at the start of two consecutive ignition cycles.

A magnitude of a difference between the two changes in SOC values may be computed. The magnitude may be compared to an error threshold as follows:

$$|\Delta SOC_{Ah} - \Delta SOC_{OCV}| > \varepsilon \quad (5)$$

where $\varepsilon$ is a predetermined error magnitude above which the battery capacity may be updated.

The capacity comparison may check the difference between the change in SOC based on current integration and the change in SOC based on the OCV difference. If the magnitude (e.g., absolute value) of the difference is less than or equal to the threshold, $\varepsilon$, then no adjustment to battery capacity is needed. If the absolute value of the difference is greater than the threshold, $\varepsilon$, then a capacity update condition may be flagged. The difference information may be recorded in the buffer. A difference magnitude greater than the threshold may indicate that the battery capacity value is inaccurate.

The difference between the model-based capacity and the OCV-based capacity may be calculated using equation (6). When the capacity is flagged as updated, the capacity difference value may be stored in the buffer for future capacity updates. Due to the normal SOC operating range in FHEV and mHEV (e.g., SOC maintained in relatively flat portion of SOC-OCV curve), the OCV based capacity learning may introduce large errors since deriving SOC from OVC is sensitive to cell voltage sensor accuracy. The capacity produced by the battery model may be more accurate than the OCV-based capacity. The model-based capacity may be used for battery control and the OCV may be used to check if there is a large difference in the SOC change.

$$\Delta\ Capacity = \frac{(\Delta SOC_{OCV} - \Delta SOC_{Ah}) * \int idt}{\Delta SOC_{OCV} * \Delta SOC_{Ah}} \quad (6)$$

The controller may store a buffer of N records in non-volatile memory for the capacity computations. Each of the N records may represent one of a plurality of time intervals. At each update period, the present buffer index may be compared to a maximum index to determine if the buffer is full. If the buffer is full (e.g., $N \geq N_{max}$) then the oldest data in the buffer may be replaced with the present data. The buffer may maintain values for the most recent N values.

To ascertain if the battery capacity should be updated, the buffer entries may be analyzed to determine if the difference is a recurring event. A ratio of a number of times the difference magnitude exceeds the threshold to the total number of recorded buffer entries may be computed. If the ratio exceeds a predetermined value, then the battery capacity may be adjusted. If the ratio does not exceed the predetermined value, the battery capacity may be maintained at the present value. For example, if 80% of the buffer entries exceed the threshold, then the battery capacity value may be updated. Further, this filtering helps to minimize changing the battery capacity based on noise in the measurements.

The battery capacity may be changed according to an average of the differences stored in the buffer. The buffer may be cleared or reset so that the process may be repeated. The average value of the difference values may be computed as a summation of the difference values divided by $N_\varepsilon$, the number of samples in which the SOC difference satisfies (5). The battery capacity update may be computed as:

$$Capacity_{model\_updated} = Capacity_{model} + (\Sigma_{i=1}^{N_\varepsilon} \Delta Capacity_i)/N_\varepsilon \quad (7)$$

The strategy determines battery capacity changes by comparing the changes in SOC using two different methods. One part of the comparison is the current integration portion that includes the estimated battery capacity from the model. Another portion of the comparison is the OCV derived change in SOC. As the battery capacity changes, the two portions may provide a different change in SOC. When an error between the two persists for more than a predetermined number of samples, the battery capacity value may be updated.

The logic described may be utilized to select an OCV-SOC curve that represents the present stage of battery life. The change in SOC may be computed based on the present OCV-SOC curve (e.g., FIG. 3, 302). The change in SOC may also be computed for the next stage-of-life OCV-SOC curve (e.g., FIG. 3, 304). The difference magnitude may be computed with both SOC-based change values. The resulting different magnitudes may be compared. The controller may adjust the selection of the present OCV-SOC curve when the difference magnitude for the present curve is larger than the difference magnitude for the next stage of battery life. The controller may change the OCV-SOC curve selection when the condition persists for a predetermined number of cycles. The process may be repeated over the life of the traction battery. The result would be that at the end of the battery lifetime, the EOL OCV-SOC would be utilized. An age indicator may be based on the selected curve. For example, if the MOL curve is presently selected, the age indicator may indicate a MOL state for the traction battery.

The estimated battery capacity value may be used to provide an age indication for the traction battery. A ratio of the estimated battery capacity to the BOL battery capacity may be computed. The ratio may indicate a percentage of battery capacity remaining (e.g., capacity retention). In other configurations, the capacity retention may be subtracted from one-hundred percent to obtain the capacity decay value.

The estimated battery capacity and/or the capacity retention/decay values may be stored in non-volatile memory to retain the values between ignition cycles. The capacity retention/decay value may be displayed as a continuous value or percentage. The capacity retention/decay value may be translated to indicate discrete life states. For example, the display may indicate BOL, MOL, and EOL states to the operator. Each life state may translate to a range of capacity retention/decay values.

Figure 4:
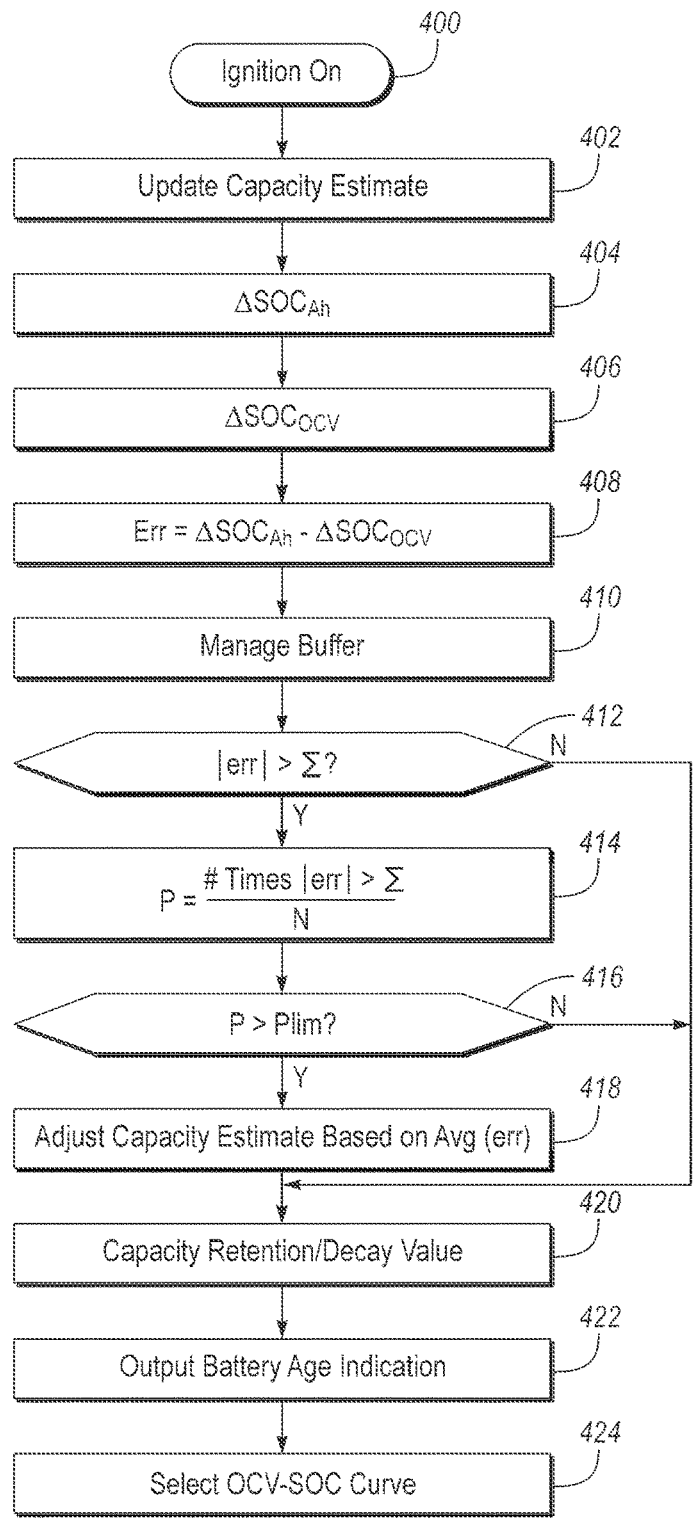
FIG. 4 is a flowchart of a possible sequence of operations for estimating battery capacity.

FIG. 4 is flowchart depicting a possible sequence of operations that may be implemented in the BECM 206. The sequence may begin at entry block 400 with the vehicle being in an ignition-on condition. At operation 402, the battery capacity estimate may be updated as described. The capacity estimate may include a contribution from the parking time based on the temperature history and an operating time due to vehicle operation. At operation 404, a current-based estimate of SOC is computed based on the current integration and capacity. The current-based estimates may be based on an integration of battery current over associated time intervals and the battery capacity estimate.

At operation 406, a voltage-based estimate of SOC is computed based on two voltage measurements. The voltage-based estimates may be updated based on a difference between a first state of charge value associated with a previous ignition cycle and a second state of charge value associated with a present ignition cycle. The controller may measure a first open-circuit voltage at initiation of the previous ignition cycle and estimate the first state of charge value based on the first open-circuit voltage, and measure a second open-circuit voltage at initiation of the present ignition cycle and estimate the second state of charge value based on the second open-circuit voltage. The first state of charge value and the second state of charge value may be estimated based on one of a plurality of characteristic curves selected based on the battery capacity estimate.

At operation 408, a difference or error between the current-based SOC estimate and the voltage-based SOC estimate is computed. At operation 410, the buffer of stored information may be processed and managed. For example, the stored values may be retrieved and processed. The controller may be programmed to retain differences for a predetermined maximum number of time intervals.

At operation 412, a magnitude of the error is compared to a threshold. If the error magnitude exceeds the magnitude threshold, operation 414 may be executed. At operation 414, a number of times that the error magnitude exceeds the magnitude threshold may be computed. The number of times may be obtained by counting the number of error magnitudes stored in the buffer that exceed the magnitude threshold. In addition, a percentage of samples from the buffer data having an error magnitude greater than the magnitude threshold is determined. At operation 416, the percentage is compared to a threshold. Alternatively, the number of times that the differences exceed the magnitude threshold may be compared to a predetermined value. If the percentage exceeds a predetermined percentage, then operation 418 is executed. At operation 418, the battery capacity is altered or adjusted based on the average of the errors stored in the buffer. Execution may then proceed to operation 420.

If the error magnitude is less than or equal to the threshold or the percentage is less than or equal to the predetermined percentage, then operation 420 is executed. At operation 420, the capacity retention/decay value is computed. At operation 422, the battery age may be computed and output to the instrument panel. The battery age may be computed as a ratio of the battery capacity estimate to a beginning-of-life battery capacity.

At operation 424, the OCV-SOC curve associated with the battery age indicator may be selected for upcoming cycles. The controller may be programmed to select one of a plurality of characteristic curves relating open-circuit voltage to state of charge for operating the traction battery. In response to differences associated with a presently selected characteristic curve exceeding differences associated with a next stage-of-life characteristic curve for a predetermined number of times, the controller may select the next stage-of-life characteristic curve for operating the traction battery. The traction battery may then be operated according the estimated battery capacity and the selected characteristic curve. The sequence of operations may be repeated at every ignition cycle.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle power system comprising:
a controller programmed to operate a battery according to a battery capacity estimate and, in response to differences between current-based estimates and voltage-based estimates of changes in battery states of charge exceeding a magnitude threshold a predetermined number of times, alter the battery capacity estimate based on an average of the differences.

2. The system of claim 1 wherein the controller is further programmed to update the current-based estimates based on an integration of battery current over associated time intervals and the battery capacity estimate from a battery model.

3. The system of claim 1 wherein the controller is further programmed to update the voltage-based estimates based on a difference between a first state of charge value associated with a previous ignition cycle and a second state of charge value associated with a present ignition cycle.

4. The system of claim 3 wherein the controller is further programmed to measure a first open-circuit voltage at initiation of the previous ignition cycle and estimate the first state of charge value based on the first open-circuit voltage, and measure a second open-circuit voltage at initiation of the present ignition cycle and estimate the second state of charge value based on the second open-circuit voltage.

5. The system of claim 3 wherein the controller is further programmed to estimate the first state of charge value and the second state of charge value based on one of a plurality of characteristic curves selected based on the battery capacity estimate.

6. The system of claim 1 wherein the controller is further programmed to output a battery age indicator that is based on the battery capacity estimate.

7. The system of claim 6 wherein the controller is further programmed to output the battery age indicator as a ratio of the battery capacity estimate to a beginning-of-life battery capacity.

8. The system of claim 1 wherein the controller is further programmed to retain differences for a predetermined maximum number of time intervals and wherein the predetermined number of times is a predetermined percentage of the predetermined maximum number.

9. A method comprising:
changing by a controller a battery capacity estimate in response to differences between current-based estimates and voltage-based estimates of changes in battery states of charge exceeding a magnitude threshold a predetermined number of times; and
operating by the controller a traction battery for a vehicle according to the battery capacity estimate.

10. The method of claim 9 further comprising updating by the controller the current-based estimates according to a quotient of an integration of a battery current over associated time intervals and the battery capacity estimate.

11. The method of claim 9 further comprising updating by the controller the voltage-based estimates according to a difference between a first state of charge value associated with a previous ignition cycle and a second state of charge value associated a present ignition cycle.

12. The method of claim 9 further comprising outputting by the controller a battery age indicator that is based on the battery capacity estimate.

13. The method of claim 9 further comprising retaining by the controller the differences for a predetermined maximum number of time intervals, wherein the predetermined number of times is a predetermined percentage of the predetermined maximum number.

14. A vehicle power system comprising:
a controller programmed to output a battery age indicator based on a battery capacity estimate and, in response to differences between current-based estimates and voltage-based estimates of changes in battery states of charge exceeding a magnitude threshold a predetermined number of times, alter the battery capacity estimate based on an average of the differences.

15. The system of claim 14 wherein the controller is further programmed to output the battery age indicator as a ratio of the battery capacity estimate to a beginning-of-life battery capacity.

16. The system of claim 14 wherein the controller is further programmed to update the current-based estimates based on an integration of battery current over associated time intervals and the battery capacity estimate.

17. The system of claim 14 wherein the controller is further programmed to update the voltage-based estimates based on a difference between a first state of charge value associated with a previous ignition cycle and a second state of charge value associated with a present ignition cycle.

18. The system of claim 17 wherein the controller is further programmed to measure a first open-circuit voltage at initiation of the previous ignition cycle and estimate the first state of charge value based on the first open-circuit voltage, and measure a second open-circuit voltage at initiation of the present ignition cycle and estimate the second state of charge value based on the second open-circuit voltage.

19. The system of claim 17 wherein the controller is further programmed to estimate the first state of charge value and the second state of charge value based on one of a plurality of characteristic curves selected based on the battery capacity estimate.

20. The system of claim 14 wherein the controller is further programmed to select one of a plurality of characteristic curves relating open-circuit voltage to state of charge for operating a traction battery and, in response to differences associated with a presently selected characteristic curve exceeding differences associated with a next stage-of-life characteristic curve for the predetermined number of times, select the next stage-of-life characteristic curve for operating the traction battery.

* * * * *